US006287644B1

United States Patent
Jackson et al.

(10) Patent No.: US 6,287,644 B1
(45) Date of Patent: Sep. 11, 2001

(54) CONTINUOUSLY-GRADED BOND COAT AND METHOD OF MANUFACTURE

(75) Inventors: Melvin Robert Jackson; Ann Melinda Ritter, both of Niskayuna; Michael Francis Xavier Gigliotti, Jr., Scotia; Ji-Cheng Zhao, Niskayuna, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/346,915

(22) Filed: Jul. 2, 1999

(51) Int. Cl.⁷ ....................................................... B05D 3/06
(52) U.S. Cl. .......................... 427/566; 427/567; 427/585
(58) Field of Search ................................. 428/610, 623, 428/627, 650, 651, 680; 416/241 R; 427/562, 564, 566, 405, 419.1, 419.7, 567, 568, 585

(56) References Cited

U.S. PATENT DOCUMENTS

| 4,339,509 | * | 7/1982 | Dardi et al. ........................... 428/632 |
| 4,820,358 |   | 4/1989 | Chang ..................................... 148/13 |
| 5,236,745 |   | 8/1993 | Gupta et al. ........................... 427/454 |
| 5,403,669 |   | 4/1995 | Gupta et al. ........................... 428/550 |
| 5,834,070 |   | 11/1998 | Movchan et al. . |
| 5,912,087 | * | 6/1999 | Jackson et al. ....................... 428/610 |

FOREIGN PATENT DOCUMENTS

| 01836381 | 6/1986 | (EP) . |
| 06051961 | 7/1994 | (EP) . |

OTHER PUBLICATIONS

AIAA–80–1193, Development of Improved Durability Plasma Sprayed Ceramic Coatings for Gas Turbine Engines —AAIA/SAE/ASME 16th Joint Propulsion Conference, Jun. 30–Jul. 2, 1980, Hartford Connecticut, pp. 1–13.

* cited by examiner

*Primary Examiner*—Deborah Jones
*Assistant Examiner*—Bryant Young
(74) *Attorney, Agent, or Firm*—Noreen C. Johnson; Douglas E. Stoner

(57) ABSTRACT

A continuously-graded bond coat comprises a gradient of at least one material characteristic value. The gradient extends from a first material characteristic value at a first surface region to a second material characteristic value at a second surface region. The continuously-graded bond coat can be used in a thermal barrier coating system. A source ingot for forming the continuously-graded bond coat comprises aluminum, in an atomic percent range from about 50.0 to less than about 100.0; chromium in an atomic percent range from about 5.0 to about 40.0; silicon in an atomic percent range from about 1.0 to about 17.0; zirconium in an atomic percent range from about a trace to about a 0.5, yttrium in an atomic percent range from a trace to about 2.0; and hafnium in an atomic percent range from about 0.5 to about 2.0. A method for forming the continuously-graded bond coat with the gradient is also provided by the invention.

10 Claims, 8 Drawing Sheets

CONTINUOUSLY-GRADED BOND COAT AND METHOD OF MANUFACTURE

This invention was made with Government support under Government Contract No. F49620-95-C0028, awarded by the United States Air Force. The Government may have certain rights to this invention.

FIELD OF THE INVENTION

The invention is related to protective coatings, including protective coatings on articles that are exposed to high temperatures. In particular, this invention is related to a continuously graded aluminide-based bond coat on articles exposed to high temperatures, such as components of turbines and engines, and their methods of manufacture.

BACKGROUND OF THE INVENTION

An operating environment within a turbine is typically thermally and chemically hostile to materials used to form turbines and turbine components. Significant advances in high temperature alloys for these turbine components have been achieved through the formulation of superalloy materials, including iron-based, nickel-based, nickel-iron-based and cobalt-based superalloys. Turbine components formed from these materials, however, normally cannot withstand long service exposures at high temperatures if located in certain sections of a turbine.

One proposed solution to permit turbine components to withstand long-service, high-temperature exposures includes protecting surfaces of turbine components with a coating. The coating may comprise an aluminide coating or a thermal barrier coating system (TBCS). A TBCS includes an environmentally-resistant bond coat on the component (substrate) and a layer of thermal-insulating ceramic layer as a thermal barrier coating (TBC), which is applied over the bond coat.

A TBC typically comprises a layer that includes, but is not limited to, zirconia ($ZrO_2$) in the form of partially- or fully-stabilized in the cubic zirconia crystal form. This layer should reduce generation of phase transformation stresses. The partially- or fully-stabilized zirconia (hereinafter referred to as "modified zirconia") is stabilized by one of yttria ($Y_2O_3$), magnesia (MgO), and other oxides. Modified zirconia exhibits low thermal conductivity, and thus provides thermal protection for turbine components. Modified zirconia possesses a thermal conductivity that is generally about $\frac{1}{20}^{th}$ that of a turbine component's substrate, so as to provide a temperature drop across the TBC in a range between about 25° C. and about 150° C., depending on the TBC layer's thickness and a substrate's cooling rate. Further, modified zirconia is a desirable material for thermal protection applications of turbine components because the modified zirconia reasonably adheres well to turbine substrate materials, compared to the adherence of other ceramic materials.

Bond coats for a TBCS typically comprise an oxidation-resistant alloy, such as MCrAlY, where M is at least one of iron, cobalt and nickel. Alternatively, a bond coat comprises a diffusion aluminide or platinum-aluminide material that forms an oxidation-resistant intermetallic component. Bond coats mechanically interlock, or join, the substrate to the TBC. Bond coats also protect the underlying turbine component substrate by forming a protective oxidation barrier that protects the turbine component substrate when a TBC spalls, separates from the turbine component, and exposes the turbine component substrate to hot gases. The protective, oxidation barrier is typically formed by reaction of oxygen with a bond coat's constituents.

A bond coat's aluminum content creates a desirable, strongly-adherent, continuous aluminum oxide layer. The desirable aluminum oxide layer acts as a protective oxidation barrier, and typically comprises an alumina scale, which is often referred to as a "thermally-grown oxide" (TGO). The alumina scale is slowly formed at elevated temperatures, and protects bond coats from rapid oxidation and hot corrosion during elevated temperature applications.

Oxidation that occurs to form the TGO during elevated temperature service gradually depletes aluminum from the bond coat. Eventually, the bond coat's aluminum content is depleted to a point that the protective TGO growth cannot occur. This reduced, aluminum level in a bond coat is undesirable because, in addition to the non-growth of protective TGOs, a growth of undesirable, non-protective oxides is promoted.

The non-protective oxides promote spallation in the TBCS. The spallation may cause separation of the TBCS components during elevated temperature applications. Separation at interfaces between the bond coat and TBC due to expansion amount mismatches occurs. These expansion amount differences are mainly due to different coefficients of thermal expansion (CTE) of the components of the TBCS. Therefore, a need for a bond coat in which non-protective oxides growth is minimal, and spallation and separation are avoided, exists.

Bond coats comprising layered, step-graded thermal properties have been proposed to reduce non-protective oxides growth, and to avoid spallation and separation. These layered, step-graded bond coats attempt to avoid spallation and separation by minimizing differences in thermal expansion in thermal barrier coating system (TBCS) components. FIG. 1 illustrates an example of one thermal barrier coating system 100, where a bond coat 114 includes distinct, step-graded inner and outer layers 111 and 113. Inner and outer layers 111 and 113 possess CTE values that are between a CTE value of the substrate 110 and the CTE of the ceramic TBC 112, respectively. The CTE value of the inner layer 111 is closer to the CTE value of the substrate 110 than to the CTE value of the TBC 112. The CTE value of the outer layer 113 is closer to the CTE value of the ceramic 112 than to the CTE value of the substrate 110. Thus, the expansion amounts, under similar conditions, of inner layer 111 and its adjoining substrate 110, and outer layer 113 and the TBC 112 are relatively close in value. Thus, expansion amount differences are minimal, under similar conditions, and spallation and separation at their respective interfaces, 117 and 118, are avoided. An interface 115 between the inner layer 111 and the outer layer 113, however exhibits abrupt, stepped, and discontinuous changes in material property characteristics (hereinafter referred to as "material characteristics"), including CTEs. Therefore, expansion amounts at the interface 115 may differ in amounts that cause spallation and separation thereat. Accordingly, a TBCS may have its overall TBCS life shortened.

The widths of the different layers that are illustrated in FIG. 1 schematically correspond to the expansion that each layer would undergo if each layer were unconstrained at its interfaces with its neighbors as graphically illustrated, steps in expansion amounts are evident at interfaces 1, 2, and 3. The expansion at interfaces 1, 2, and 3 are not similar and the differences there at are so great that separation at the interfaces often causes failure of the TBCS.

Therefore, a need for a bond coat for a thermal barrier coating system that avoids spallation and separation exists.

The bond coat should exhibit material characteristics, such as CTEs, that minimize stresses and separation.

SUMMARY OF THE INVENTION

One exemplary embodiment of the invention provides a continuously-graded bond coat. The continuously-graded bond coat comprises a gradient of at least one material characteristic. The gradient extends from a first value for the material characteristic at a first surface region to a second value for the material characteristic at a second surface region.

Another exemplary embodiment of the invention is a thermal barrier coating system that includes a continuously-graded bond coat, where the continuously-graded bond coat comprises a gradient of at least one material characteristic. The gradient extends from a first value for the material characteristic at a first surface region to a second value for the material characteristic at a second surface region.

A further exemplary embodiment of the invention provides a source ingot for forming the continuously-graded bond coat. The source ingot comprises aluminum, in an atomic percent range from about 50.0 to less than about 100.0; chromium in an atomic percent range from about 5.0 to about 40.0; silicon in an atomic percent range from about 1.0 to about 17.0; zirconium in an atomic percent range from about a trace to about a 0.5, yttrium in an atomic percent range from a trace to about 2.0, and hafnium in an atomic percent range from about 0.5 to about 2.0.

A still further exemplary embodiment of the invention provides a method for forming a protective coating. The protective coating comprises a continuously-graded bond coat with a gradient of at least one material characteristic. The gradient extends from a first value for the material characteristic at a first surface region to a second value for the material characteristic at a second surface region.

These and other aspects, advantages and salient features of the invention will become apparent from the following detailed description, which, when taken in conjunction with the annexed drawings, disclose embodiments of the invention.

BRIEF DESCRIPTION OF THE DRAWINGS

The invention will now be described from the following detailed description of the invention taken in conjunction with the drawings, where like parts are designated by like reference characters throughout the drawings, and in which.

DETAILED DESCRIPTION OF THE INVENTION

Figure 1:
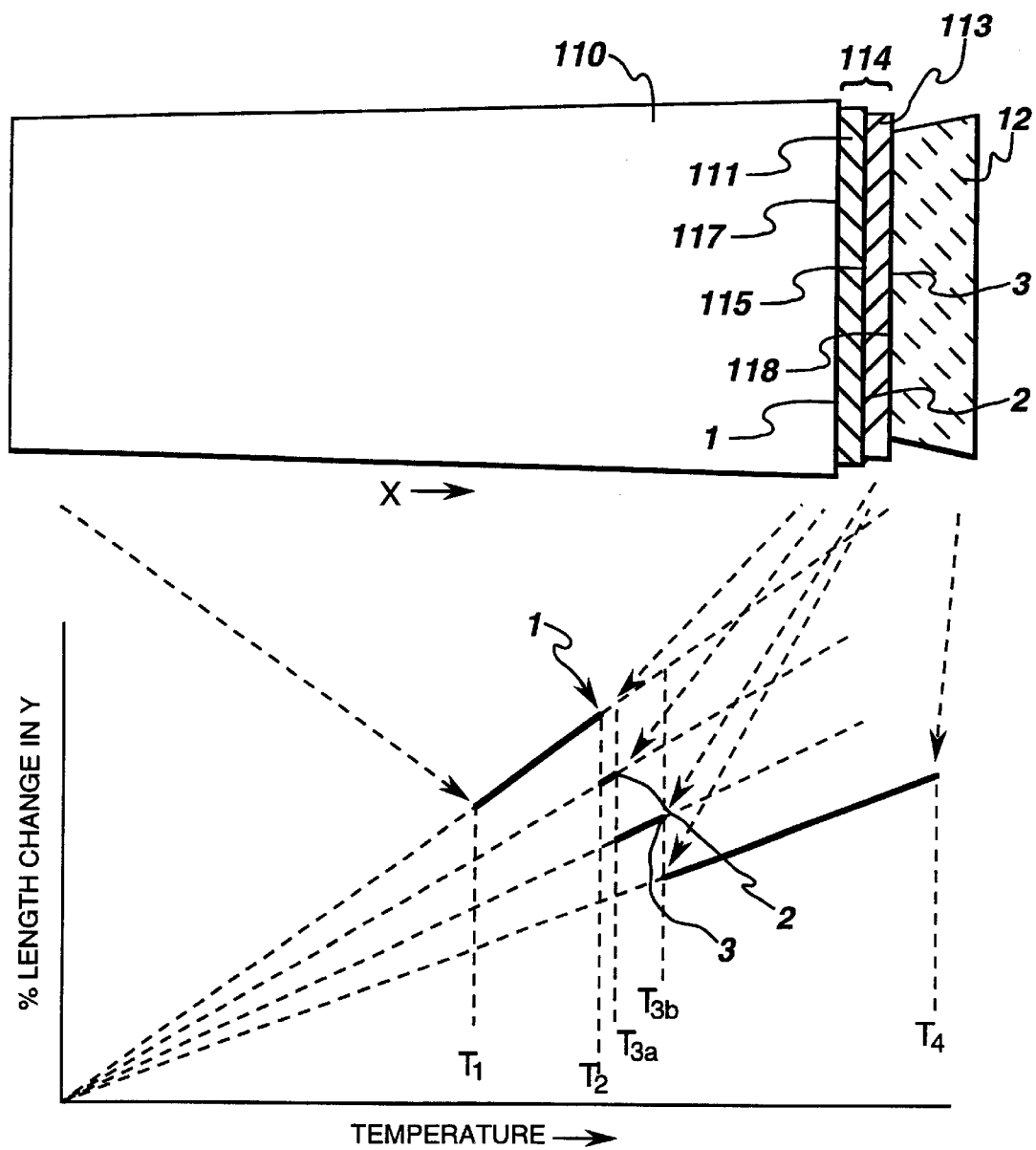
FIG. 1 is a schematic and graphic illustration of a layered, step-graded bond coat composition with corresponding temperatures and expansion amounts in a prior art thermal barrier coating system.

In the following description, material compositions are provided in volume fraction percent unless otherwise expressed. Individual compositions are provided in atomic percent, unless otherwise provided. For example, if a mixture comprises about 70% of Constituent A and about 30% of constituent B, the percents are in approximate atomic percents. Nomenclature used for compositions is as follows: if Composition A comprises Ni-23Cr-12Al-0.2Y, yttrium is provided at 0.2 atom percent, aluminum is provided at 12 atom percent, chromium is provided at 23 atom percent, and nickel is provided as the balance atom percent.

Hot-section gas path surfaces in modern jet engines and gas turbines, including buckets, rotors, turbine tips, nozzles, blades, vanes, and airfoils, and their components (hereinafter "turbine components"), are exposed to oxidizing gases at high temperatures. These temperatures often exceed about 1350° C., and can reach temperatures as high as about 1650° C. Turbine components are typically formed from high-temperature resistant materials. Exemplary high-temperature resistant materials include, but are not limited to, nickel-based superalloy materials, iron-based superalloy materials, nickel-iron-based superalloy materials, and cobalt-based superalloy materials. The following description refers to a nickel-based superalloy material, however this material is merely exemplary of substrate materials within the scope of the invention, and is not meant to limit the invention in any way. Other high-temperature resistant materials are within the scope of the invention.

Turbine components require thermal protection at these temperatures to prevent melting, severe environmental attack, and structural weakening of the turbine component. The thermal protection is typically provided by at least one of thermal insulation and cooling. Thermal protection by thermal insulation and cooling usually adversely impacts a turbine component's performance and efficiency. Also, geometric and manufacturing limits may prevent adequate thermal insulation and cooling of some turbine component's outer surfaces, which is undesirable.

Thermal insulation of a substrate is often provided by disposing a thermal barrier coating (TBC), which typically comprises a thin layer of ceramic material on bond coat. The bond coat is disposed on a substrate, for example a turbine component, to prevent its severe environmental attack, and structural weakening. The bond coat is disposed between the substrate and the TBC with an inner surface region (hereinafter "inner surface") of the bond coat being disposed against the substrate and an outer surface region (hereinafter "outer surface") of the bond coat being disposed against the TBC. The bond coat and TBC are collectively referred to herein as a "thermal barrier coating system" (TBCS).

A bond coat, as embodied by the invention, comprises a non-layered, metallic (non-ceramic), continuously-graded structure (hereinafter "continuously-graded bond coat"). The continuously-graded bond coat is a bond coat that provides smooth, non-abrupt, gradients of at least the material's thermal characteristic values and properties (hereinafter "material characteristics") across the bond coat from the substrate to the TBC. These material characteristics include, but are not limited to, coefficients of linear thermal expansion (CTE). The term gradient means that properties have a rate of regular or graded change, for example a change with a specified change in direction or distance.

The gradient of the material characteristics in the continuously-graded bond coat, as embodied by the invention, does not exhibit abrupt structural and material characteristic discontinuities, contrary to prior art systems (see FIG. 1). For example, a gradient of CTEs for the continuously-graded bond coat may have a maximum CTE value adjacent the substrate and a lower CTE value with increasing depth in the continuously-graded bond coat. Accordingly, the CTEs decrease from an inner surface of the continuously-graded bond coat to an outer surface of the continuously-graded bond coat. Thus, material characteristic differences, such as CTEs, do not cause expansion-amount mismatches (hereinafter "mismatches"). Therefore, the time to first spallation and separation are generally extended in a TBCS that is provided with the continuously-graded bond coat, as embodied by the invention. Further, the continuously-graded bond coat avoids undesirable, harmful stresses between components of the TBCS. Therefore, an enhanced TBCS life is provided.

The continuously-graded bond coat, as embodied by the invention, is formed by controlling phase and elemental distributions during its manufacturing. The control of phase and elemental distributions in the manufacturing, as embodied by the invention, is achieved by controlling deposition of the continuously-graded bond coat. The controlled deposition selectively disposes materials from a source ingot onto a substrate to form the continuously-graded bond coat.

The continuously-graded bond coat, as embodied by the inventor, also reduces stresses that are capable of causing spallation in a TBCS. The constituents of the continuously-graded bond coat vary at least one of thermal expansion, thermal conductivity, and elastic modulus in amount sufficient to reduce stresses that may cause spallation.

A source ingot comprises metallic active materials and at least one metallic, base material. The base material comprises at least aluminum. The active materials comprise, but are not limited to, chromium (Cr), silicon (Si), hafnium (Hf), zirconium (Zr), yttrium (Y), compounds, alloys, and combinations thereof. The chromium lends to formation of second phases such as α-Cr and Cr₃Si, in the continuously-graded bond coat, as discussed hereinafter. Hafnium and silicon are desirable in a continuously-graded bond coat because each is a known oxidation-resistant material, and each decreases the spalling rate of oxide layers. Zirconium and yttrium, in a desirable in a continuously-graded bond coat because each is a known oxidation-resistant material, and each decreases the spalling rate of oxide layers. Zirconium and yttrium, in a continuously-graded bond coat, each decrease the spalling rate of oxide layers. α-Cr and Cr₃Si each affect coefficients of expansion, while yttrium, hafnium, and zirconium affect adherence properties of the continuously-graded bond coat more than they affect the coefficients of expansion.

The scope of the invention also includes use of two distinct evaporation sources to form the continuously-graded bond coat. If two evaporation sources are available for simultaneous evaporation to form the continuously-graded bond coat, a second melt pool comprising nickel (Ni) can be used to continuously deposit nickel to react with the deposited aluminum (Al), forming NiAl. Accordingly, little, if any, nickel from a superalloy substrate is used to form the nickel-aluminum region, as described hereinafter. Thus the superalloy substrate maintains its nickel integrity, which is desirable to maintain a substrate's life.

The source ingot materials each possess different CTEs that, when deposited in the continuously-graded bond coat, as embodied by the invention, result in the gradient of CTEs. The coefficients of linear thermal expansion (CTE) for active materials and base materials are as follows (from *Metals Handbook, Desk Edition*, ASM (1995)):

| Material | CTE @ 20° C. in. K$^{-1}$ ($\mu$ in/in° C.) $\alpha \times 10^6$ |
| --- | --- |
| Al | 26.6 |
| Cr | 6.2 |
| Hf | 5.9 |
| Si | 2.8–7.3 |
| Zr | 5.85 |
| Y | 10.6 |
| Ni | 13.3 |

Formation processes (manufacturing methods) for the continuously-graded bond coat include, but are not limited to, electron beam (EB) evaporation and deposition processes. Ion plasma deposition and physical vapor deposition processes, such as, but not limited to, sputtering, can also be used. The following process description discusses EB evaporation as the continuously-graded bond coat manufacturing method. This method is merely exemplary of methods within the scope of the invention, and is not meant to limit the invention in any way.

Figure 2:
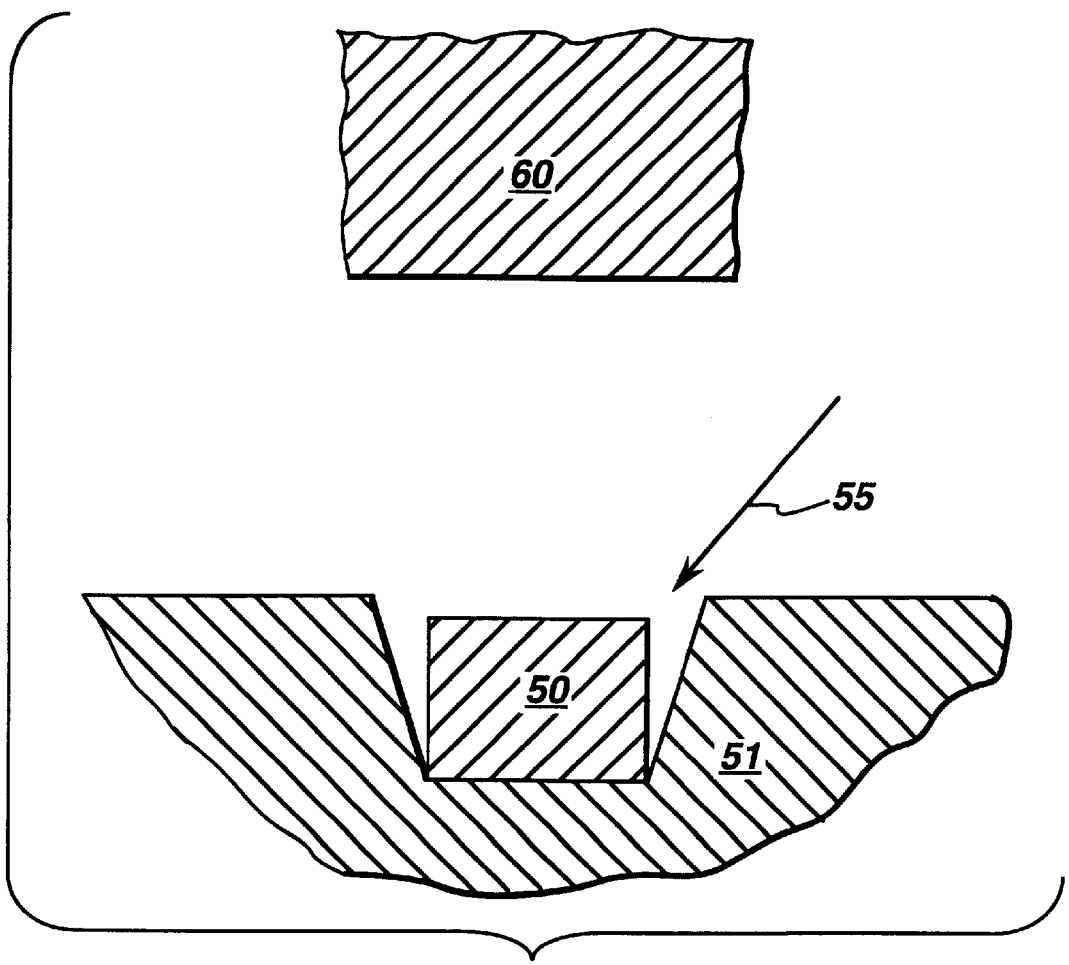
FIG. 2 is a schematic, part-sectional illustration of a system for evaporating source ingot.
Figure 3:
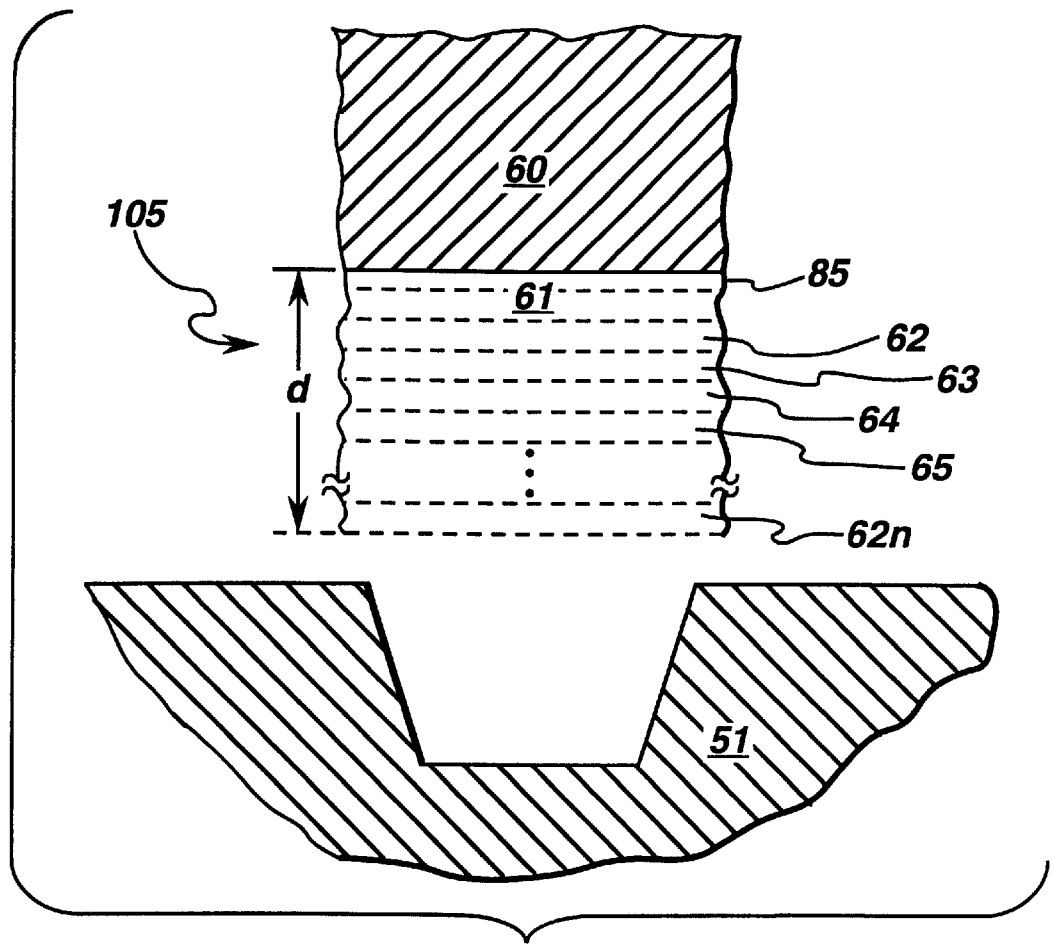
FIG. 3 is a schematic, part-sectional illustration during formation a graduated, non-layered, continuously-graded bond coat for a thermal barrier coating system.
Figure 4:
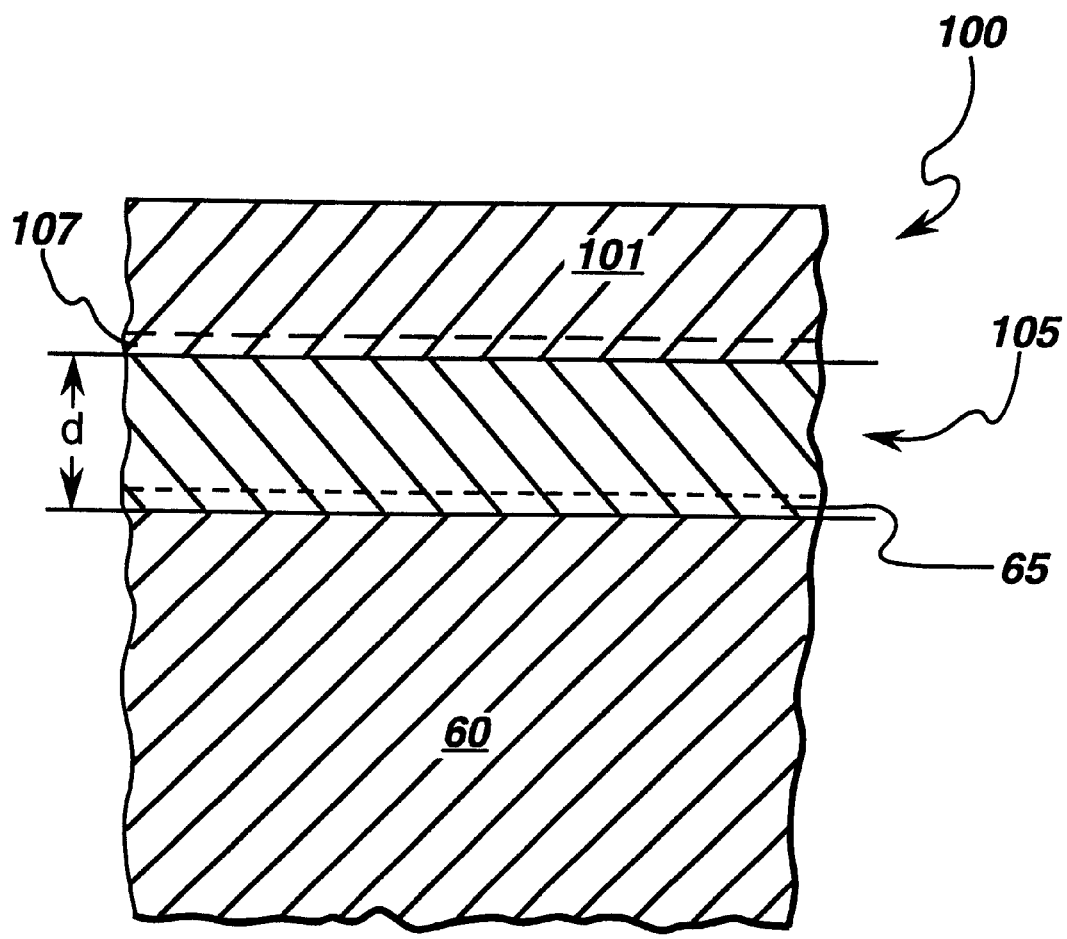
FIG. 4 is a side, part-sectional view of a thermal barrier coating system including a graduated, non-layered, continuously-graded bond coat.
Figure 5:
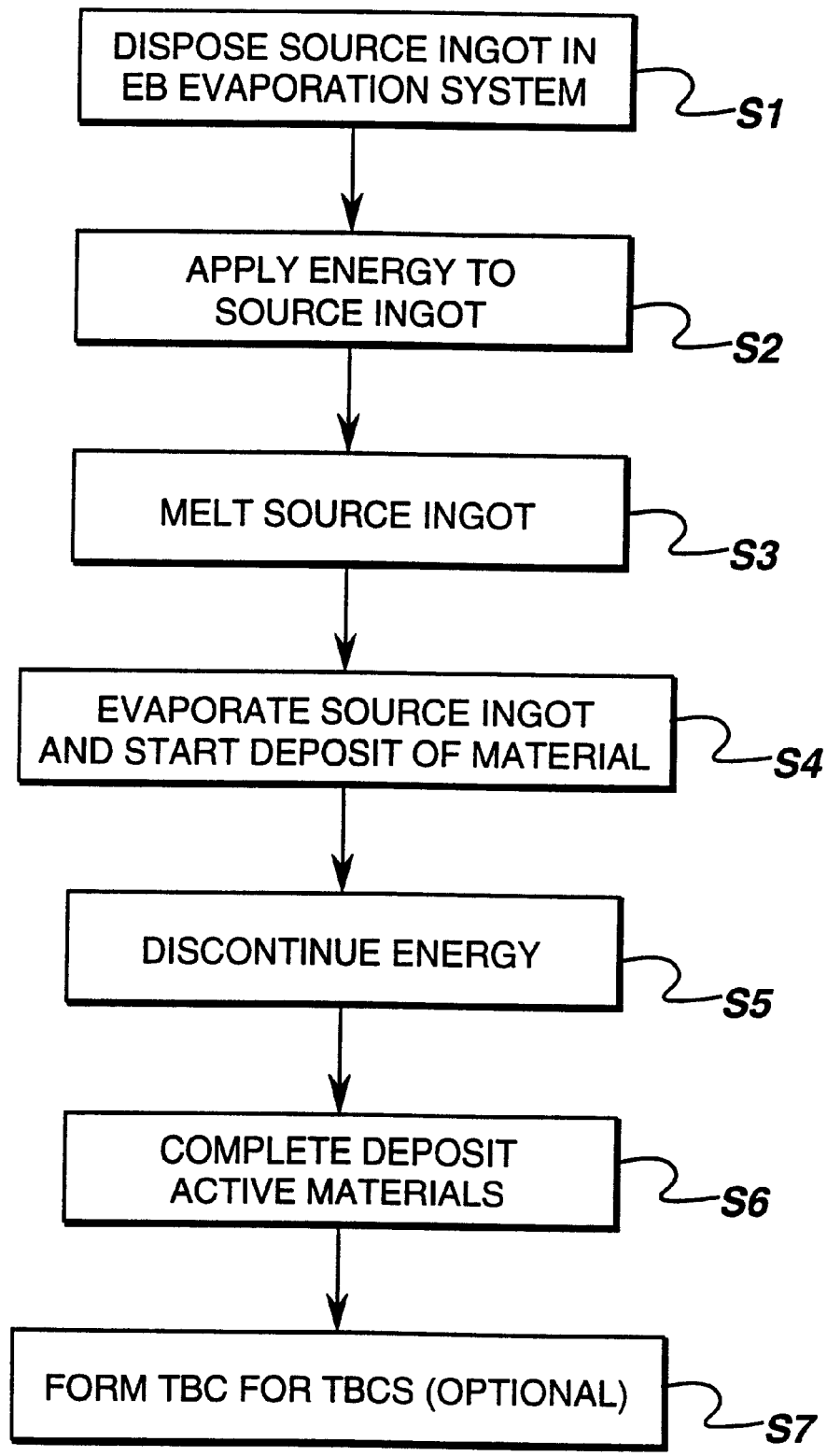
FIG. 5 is a flow chart of one method of manufacture of a continuously-graded bond coat for a thermal barrier coating system.

FIGS. 2 and 3 illustrate an EB evaporation system that melts and evaporates a source ingot to form a continuously-graded bond coat 105 (FIGS. 3 and 4). The description of the system is discussed with reference to a method of providing a continuously-graded bond coat and the associated flow chart of FIG. 5.

A source ingot 50 is disposed on a support 51, for example, a water-cooled tungsten support, in step S1. The source ingot 50 comprises a base material, such as, but not limited to, aluminum (Al), and also comprises at least one active material. In the following discussion, the base material is referred to as aluminum, however this is merely exemplary of source ingot base materials within the scope of the invention, and is not meant to limit the invention in any way.

An energy source, such as but not limited to, an electron beam 55, is applied to the source ingot 50 in step S2. The source ingot is heated and melted into a melt pool in step S3, using known electron beam physical vapor deposition principles. Continued application of the electron beam to the melted source ingot 50 causes evaporation thereof into a vapor cloud and the initiation of deposition of materials, in step S4. Deposition of the materials from the vapor cloud occurs almost simultaneously with the start of evaporation of the source ingot. The term simultaneously means that there is the amount of time the source ingot materials are in the vapor cloud is very small, often only in the vapor cloud for seconds. The source-ingot materials with high vapor-pressures evaporate first followed by those with decreasing vapor-pressures. For example, high-vapor pressure constituents of the source ingot are concentrated in early-formed vapor clouds. As the volume of the source ingot is decreased by continued melting and evaporation of the source ingot, the lower-vapor-pressure constituents become more concentrated in the vapor cloud. As the last of the source ingot is evaporated, the low-vapor-pressure elements in the vapor cloud, and in the deposit, are at their greatest concentrations.

Figure 6:
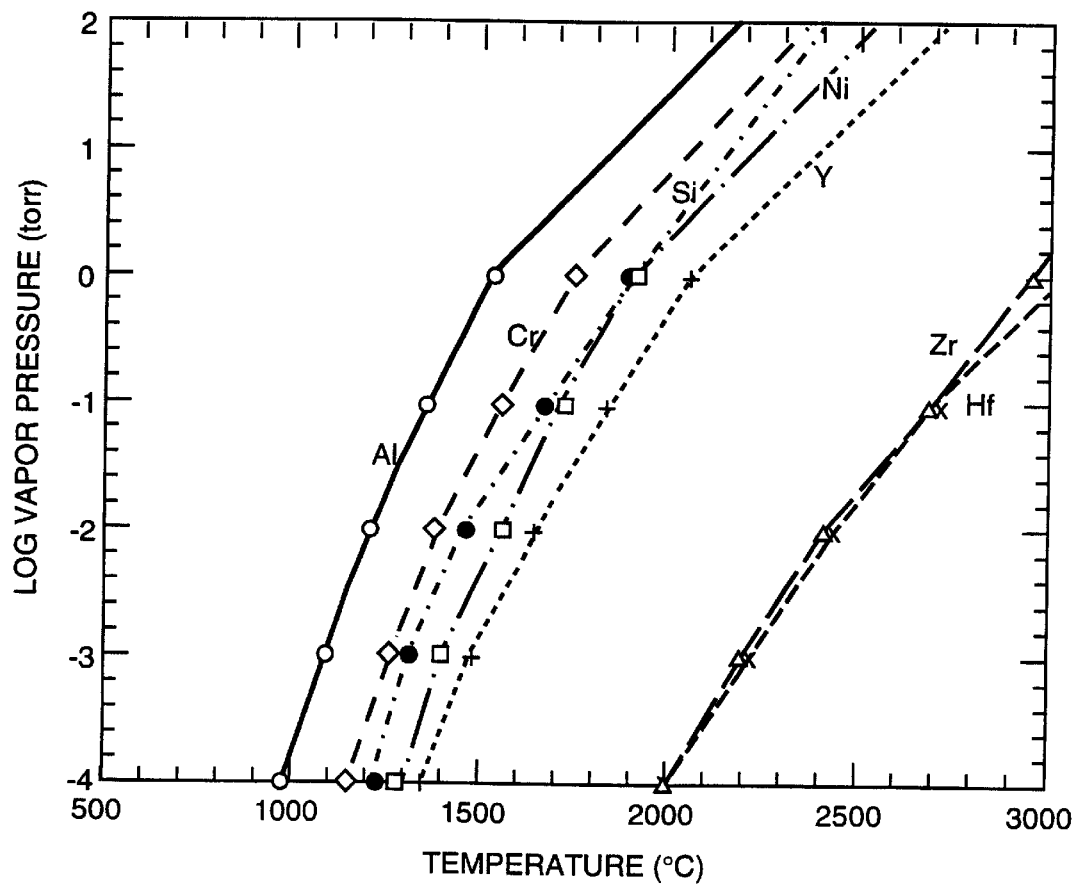
FIG. 6 is a graph representing vapor pressure (log) versus temperature for constituents of a source ingot, as embodied by the invention.

The evaporation of the source-ingot materials continues until the lowest vapor-pressure material is evaporated. When the entire source ingot 50 has been evaporated, the electron beam 55 is discontinued in step S5. Electron beam power can be varied during the deposition process to develop specific rates of compositional gradient in the deposits. A long period at low power initially will deposit aluminum preferentially early in the deposit microstructure, while a faster ramping of beam power will cause earlier evaporation of low-vapor-pressure species. The volume of the source material ingot 50 that is placed in support 51, and the distance between the source ingot 50 and the substrate determine the total thickness of the material added to the substrate by evaporation. FIG. 6 illustrates a relationship of vapor pressures (log values) of source ingot materials, as embodied by the invention, versus temperature. As illustrated, aluminum has the lowest values of vapor pressures in graphed temperatures, and thus will be the first material that is deposited.

The evaporated, source-ingot materials are deposited onto a substrate 60, for example a substrate formed of a superalloy material, to form a continuously-graded bond coat. The deposition occurs in an inert, non-oxidizing, gaseous atmosphere. The first deposited region 61 is concentrated in high vapor-pressure materials, such as, but not limited to, aluminum, which originates from the source ingot's base material. The aluminum in the first-deposited region 61 reacts with material of the superalloy substrate 60, such as, but not limited to, nickel.

The substrate 60 can be maintained at a high surface temperature, for example at a temperature in a range from about 950° C. to about 1200° C. The high surface temperature permits reaction of the deposited materials and the substrate. Alternatively, if evaporation is provided from two melt pools, one an aluminum-based melt pool and the other a nickel-based melt pool, the substrate is able to be maintained at temperatures less than about 950° C., so that the nickel-aluminum region 85 is formed primarily from deposited elements, relying only minimally on nickel (and alternatively at least one of cobalt (Co) and iron (Fe)) from the substrate. The reaction produces a nickel-aluminum region 85 (FIGS. 3 and 4) in the continuously-graded bond coat 105.

Amounts of all elements in the source ingot 50 are being evaporated continuously, and deposited simultaneously. The amount of each element in the vapor cloud at any given time in the process is dependent on its vapor pressure at the pool temperature, and on its concentration in the ever-diminishing remaining source ingot. The first-deposited region 61, which comprises nickel-aluminum, possesses material characteristics, including but not limited to CTEs, that approximate those of the substrate 60. The approximately equal characteristics are believed to be due, at least on part, to the first-deposited region 61 containing material from the substrate 60. Differences in material characteristics between the substrate 60 and first-deposited region 61 of the continuously-graded bond coat 105 are minor. Therefore, mismatches due to thermal expansion amount differences between the continuously-graded bond coat 105 and substrate 60 are of such magnitude that is small, and the protective nature of the TBCS 100 is not adversely affected so the TBCS 100 maintains its protective function.

After deposition of the high vapor-pressure materials, subsequent deposits comprise intermediate vapor-pressure materials in regions 62, 63, 64, 65 . . . ,$62_n$, where n equals the number of possible regions that are compositionally distinguished in the continuously-graded bond coat 105. Greater fractions of higher vapor-pressure materials are deposited in region 62, followed by increased fractions of lower vapor-pressure materials in descending vapor-pressure order in regions 63, 64, 65 and so forth, to region $62_n$. The subsequent deposits include active materials, and compounds, combinations, and alloys thereof, and any second phases formed thereby.

The lowest vapor-pressure material richest in the source material 50 which remains is deposited in region $^{62}n$. The last-deposited material in region $62_n$ is positioned furthest from the substrate 60 as an outer surface of the continuously-graded bond coat 105. This last-deposited region $62_n$ is disposed next to a TBC 101 (FIG. 4), when it is formed. The last-deposited region $62_n$ possesses material characteristics that approximate those of the TBC 101. Any differences in material characteristics between the TBC 101 and region $62_n$ are minor. Therefore, mismatches due to thermal expansion amount differences between the continuously-graded bond coat 105 and TBC 101 are of such magnitude that separation is minimal, and the protective nature of the TBCS 100 is not adversely affected.

The deposition process comprises a "continuous" process meaning that once deposition is initiated it continues until all evaporated materials are deposited. Thus, there are no discontinuities, step-wise changes, or breaks in the continuously-graded bond coat 105. A gradient of material characteristics gradually changes over its width d of continuously-graded bond coat 105 from the substrate 60 to the subsequently deposited TBC 101.

The continuously-graded bond coat deposition process deposits material in an order depending on their vapor pressure. Since the deposition process is continuous, deposition of evaporated material will overlap deposition of other evaporated materials. These overlapping materials have relatively close vapor pressures. Therefore, a continuous and smooth gradient of material property characteristic results. For example, if three different evaporated materials A, B, and C, which possess vapor-pressures $VP_A$, $VP_B$, and $VP_C$, with $VP_A > VP_B > VP_C$, respectively, are to be deposited on a substrate, material A is richest in the first deposit, while lesser amounts of materials B and C are present in the first deposit. Material A is first deposited on a substrate in an "A region." Prior to the total deposition of all of material A, material B starts to be deposited at increased rates, as its concentration in the remaining source ingot 50 is increased, and forms an "A-B region" that comprises materials A and B. During deposition of material B, the deposition of material A decreases as the amount of material A in the remaining source ingot 50 is being exhausted, and a "B-region" richer in material B is deposited. At a later point, deposition of material C increases. A "B-C region" that comprises B and C is formed while the amount of material A is further reduced. The deposition of material B is reduced during increasing deposition of material C, thus forming a "C-region" consisting mainly of material C, with lesser amounts of materials A and B.

Heat treatments of the continuously-graded bond coat 105 in step S7 form a protective coating, such as a TGO 107 at outer surfaces 104 of the continuously-graded bond coat 105 for a thermal barrier coating system 100. The TGO 107 typically comprises an alumina scale that is strongly-adherent to the continuously-graded bond coat 105. The TGO 107 protects the continuously-graded bond coat 105 from rapid oxidation and corrosion. For example, and in no way limiting of the invention, TGO 107 formation heat treatments are provided for about 4 hours at a temperature in a range of about 1000° C. to about 1200° C. in an oxygen partial pressure of $10^{-3}$ to $10^{-6}$ torr. An exemplary TGO 107 comprises ceramic materials, such as, but not limited to, alumina ($Al_2O_3$). The alumina is formed by reactions of the continuously-graded bond coat 105 and the heat treatment environment. Subsequently, the TBC 101 may be applied to the continuously-graded bond coat 105 by an appropriate deposition process, such as but not limited to, air plasma spraying (APS) or electron beam physical vapor deposition. These deposition processes typically occur after heat treatments of the continuously-graded bond coat 105 to form TGO 107, but can occur without any separate heat treatment of the bond coat 105, since these processes normally involve heating of the bond coat as part of the deposition processes.

The continuously-graded bond coat 105 is typically deposited on a substrate 60 in an amount less than a total desired TBCS 100 thickness. The TBC 101 is then deposited on the continuously-graded bond coat 105, so the TBC 101 and the continuously-graded bond coat 105 equal the total desired TBCS 100 thickness. For example, if a TBCS with about a 200 micron total thickness is desired, a continuously-graded bond coat 105 having a thickness in a range from about 50 microns to about 70 microns is first deposited. The remainder of the TBCS total thickness is provided by heat treatments that form the TGO 107, which has a thickness of less than about 2 microns thickness on the continuously-graded bond coat 105, and subsequent deposition of TBC 101.

Exemplary compositions for the source ingot 50 will now be discussed. One exemplary source ingot composition comprises an aluminum base material and at least one active material. The active materials comprise chromium, silicon, hafnium, zirconium, yttrium, compounds, alloys, and combinations thereof. In each of the exemplary compositions, unavoidable impurities may be found in the source ingot, however they do not impair the continuously-graded bond coat 105, and its protective functions. Further, in the following examples, "trace" means amounts more than incidental amounts.

The concentrations of the active materials are controlled in the source ingot 50. The concentrations are controlled so active material concentrations at the continuously-graded bond coat's outer regions do not exceed their respective limits in affecting beneficially the balance of oxidation resistance of the nickel-aluminum, and the expansion mismatch with the TBC 101. For example, the concentration of the active materials is typically diluted to about twice their nominal concentration in the desired continuously-graded bond coat 105. This concentration above the desired level is provided because aluminum reacts with materials in a substrate, such as, but not limited to, nickel and cobalt in a superalloy substrate, to form aluminide at nearly 50 atom percent aluminum during deposition and subsequent heat treatments. This dilution is provided in ratio of about 2:1 dilution. As an example, a source ingot of 99.5Al-0.5Zr, when reacted with substrate elements, will yield an average composition of the continuously-graded bond coat of:

$$[99.5Al+99.5Ni+0.5Zr]/[99.5+99.5+0.5]=99.75(NiAl)+0.25Zr.$$

Because of its low vapor pressure, the 0.25Zr average content in the continuously-graded bond coat is concentrated as a zirconium-rich outer layer (at 0.5–1.0 atom percent), while its concentration in the inner regions of the bond coating are much lower.

Chromium is not provided at twice the desired level since chromium levels in a superalloy substrate are generally high enough to prevent chromium reactions with superalloy substrate materials. Chromium in sufficient concentrations forms α-Cr phases in the continuously-graded bond coat 105, and can form $Cr_3Si$ phases with silicon, when present in sufficient concentrations, each of which enhances life of a continuously-graded bond coat. The chromium content in the source ingot 50 is controlled since excessive chromium may prevent desirable protective alumina scales (TGO) from forming. Thus, the active materials are able to form a desired gradient of material characteristics, including CTEs, in the continuously-graded bond coat 105.

The outer regions of the continuously-graded bond coat 105 possess a higher concentration of low-vapor-pressure active materials, as compared to inner regions proximate the substrate 60, as they are deposited in increasing fractions as the aluminum is depleted from the ever-diminishing source ingot. This higher concentration is due, at least in part, to the formation of the nickel-aluminum layer 62. The active materials are separated from the substrate 60 by the nickel-aluminum region 62. Accordingly, they do not react with the substrate, and are free to form the continuously-graded bond coat 105 with gradients of material properties, as embodied by the invention.

A source ingot 50, as embodied by the invention, comprises a base material, such as aluminum, which is provided in an atomic percent range from about 50.0 to less than about 100.0. Active materials are provided in the source ingot in the following atomic percent ranges: chromium from about 5.0 to about 40.0; silicon from about 1.0 to about 17.0; zirconium from about a trace to about a 0.5, yttrium from a trace to about 2.0; and hafnium from about 0.5 to about 2.0. In the following Example Sets, specific amounts of active materials are provided as discussed, however all active materials, in the ranges discussed herein, may be provided in a single source ingot. The Bond Coats are referred to with reference to their components, or with specific reference to second phase volume percents of the continuously-graded bond coats.

A first set of exemplary source ingot compositions, Example Set I, comprises an aluminum base material and active materials comprising chromium, silicon, and yttrium. The deposition of an Example Set I source ingot will produce deposits initially rich in aluminum, followed by increasing concentrations of chromium, silicon and yttrium. The concentration of Cr in the outer region of the deposit will be sufficient to form an α-Cr phase. The α-Cr phase provides minimal expansion amount differences at the continuously-graded bond coat 105 and TBC 101 adjoining surface. The α-Cr phase has a CTE value that is close to the CTE value of the TBC 101. Therefore, mismatches due to thermal expansion differences are of such magnitude that separation is minimal, so the protective nature of the TBCS, which is formed with source ingot compositions according to Example Set I, is not adversely effected.

Table 1 lists Bond Coats 1–3, according to Example Set I, with their respective Example Set I source-ingot compositions. The Bond Coats 1–3 provide continuously-graded bond coats with average volume percents of α-Cr of 10%, 20%, and 35%, respectively, with an aluminide matrix of approximately 45% Ni, 5% Cr, 45% Al, and 5% Si. The source ingots comprise aluminum as a base material, and chromium, silicon, and yttrium as active elements. During high temperature deposition, the aluminum and Si react to form the aluminide with nickel and cobalt from the substrate composition. After deposition and reaction, the gradient in α-Cr that results from the limited-volume evaporation varies from approximately one-quarter of the average volume percent in the first material deposited, to approximately 3–4 times the average volume percent in the last material deposited. From bulk-sample measurements we have determined that approximately 60% NiAl-40% α-Cr by volume has a CTE value closely matching that of the TBC 101. Bond Coat 1 will have the best oxidation resistance of example set I, and Bond Coat 2 will have the best CTE matching. Bond Coat 3 will have so high a Cr concentration at its outer surface that it will no longer form a protective alumina TGO, but rather a chromia or mixed-oxide scale that can lead to premature spallation of the TBC.

TABLE 1

Source Ingot Composition (weight percent)

|  | Al | Cr | Si | Y |
|---|---|---|---|---|
| Bond Coat 1 10 v/o αCr (Y) | 55.0 | 37.5 | 6.25 | 1.25 |
| Bond Coat 2 20 v/o αCr (Y) | 40.4 | 54.1 | 4.6 | 0.9 |
| Bond Coat 3 35 v/o αCr (Y) | 28.4 | 67.8 | 3.2 | 0.6 |

A second set of exemplary source ingot compositions, Example Set II, comprises an aluminum base material and hafnium and silicon as active materials. The base material of the source ingot according to Example Set II may also comprise nickel (Ni). A nickel base material in the source ingot is provided in amounts sufficient to react with source ingot's aluminum to form the nickel-aluminum region 65. Accordingly, little, if any, nickel from a superalloy substrate 60 is used to form the nickel-aluminum region 61. The outermost layers of coating have a low- aluminum nickel-aluminum layer, which does not provide adequate oxidation resistance, because an aluminum concentration is higher and peaks earlier in the coating deposition than does a nickel concentration.

Table 2 lists Bond Coats 4–8 according to Example Set II with their respective source ingots compositions. The Example Set II source-ingot compositions for the continuously-graded bond coats comprise aluminum, hafnium, and silicon. The Example Set II source-ingot compositions that form Bond Coats 7 and 8 also comprise nickel. During the deposition of the Bond Coats 4–8 continuously-graded bond coats formed from compositions according to Example Set II, aluminum will be enriched in the first portion of the coating deposited against the substrate 60. Silicon (and nickel, if provided) is then deposited more richly in intermediate portions of the continuously-graded bond coat 105, and hafnium more richly in the outer portions of the bond coat.

Hafnium and silicon are desirable in a continuously-graded bond coat because each is a known oxidation resistant material. Accordingly, each of yttrium and hafnium decreases oxide spallation rates of the TBCS that can lead to loss of the TBC, however, each possesses material characteristics, including CTEs, that approximate those of NiAl, rather than of a TBC that will be formed thereon. Therefore, mismatches due to thermal expansion amount differences are of such magnitude that separation is as problematic as it is for conventional non-graded NiAl, and the protective nature of the TBCS is not improved due to CTE matching, but only due to bond coat oxidation improvement. Further, because of the strong hafnium gradients in these coatings because of the very low vapor pressures of hafnium, the last regions of the deposit are considerably enriched in hafnium, up to five times the average concentration. Thus, the approximate 2% (atomic) source ingot produces a bond coat with an average hafnium concentration of about 1% (2Hf/[2Hf+98Al+98Ni from substrate reaction]), which has a gradient from near-zero in the first deposit to about 5% Hf in the very last material deposited. If the source ingot comprises amounts greater than about 2 atomic percent hafnium in the source ingot, the surface of the graded coating will be rich in hafnium and may develop a detrimental low-melting-point phase.

TABLE 2

Source Ingot Composition (atomic percent)

|  | Al | Hf | Si | Ni |
|---|---|---|---|---|
| Bond Coat 4 AlHfSi-1 | 93.0 | 2.0 | 5.0 |  |
| Bond Coat 5 AlHfSi-2 | 88.0 | 2.0 | 10.0 |  |
| Bond Coat 6 AlHfSi-3 | 86.0 | 4.0 | 10.0 |  |
| Bond Coat 7 AlNiHfSi-1 | 64.5 | 3.0 | 7.5 | 25.0 |
| Bond Coat 8 AlNiHfSi-1 | 46.5 | 2.0 | 1.5 | 50.0 |

A third set of exemplary source ingot compositions, Example Set III, is set forth in Table 3. The Example Set III source-ingot compositions comprise an aluminum base material, with at least one of chromium, silicon, and yttrium as active materials. As with the previous Example Sets, the aluminum is richest in the first deposited material because it possesses the highest vapor-pressure. Chromium, silicon, and yttrium, which have lower vapor pressures than aluminum, are thereafter deposited. The chromium is capable of forming α-Cr and $Cr_3Si$ phases, since it typically does not react substantially with substrate materials, for example superalloy materials. The $Cr_3Si$ and the other active materials, which are disposed in greater amounts at outer surfaces of the continuously-graded bond coat, possess material characteristics, such as CTEs, that approximate those of a TBC that is formed thereon. Therefore, mismatches due to thermal expansion amount differences are of such magnitude that separation is minimal, and the protective nature of the TBCS is not adversely effected.

The Example Set III source-ingot compositions that form Bond Coats 12–14 provide the continuously-graded bond coat 105 with average volume percents of $Cr_3Si$ of 20%, 35%, and 50%, respectively, with the volume percent increasing from lean of the average, to rich of the average, through the coating thickness. Further, the Example Set III source ingots III may contain some small amounts of yttrium therein, again, graded in composition through the coating thickness. In each case of bond coats 9–14, the aluminum and a portion of the Si and Cr will react with nickel from the substrate to produce an aluminide of approximate atomic composition 46.5Ni, 3.5Cr, 45Al, 5Si. The approximate volume percent of $Cr_3Si$ can be determined by subtracting the portion of Cr and Si consumed in the aluminide and normalizing by the deposit+consumed substrate. For Bond Coat 9, this yields:

$$[5.5Si+16.5Cr]/[(65.5Al+7.2Si+5.3Cr+67.7Ni)+5.5Si+16.5Cr] = 13\% \, Cr_3Si.$$

As was the case for continuously-graded bond coats containing Cr, those continuously-graded bond coats that contain $Cr_3Si$ have desirable oxidation resistance at average volume percents of less than about 20% Cr₃Si (Bond Coat 9). A CTE that matches the ceramic of the TBC 101 at average volume percents of 20–25% Cr₃Si is provided by Bond Coats 10 and 12. Bond Coats 11, 13, and 14 provide average volume percents of greater than about 25% Cr₃Si, in which oxidation is deteriorated because the surface volume comprising about 50% Cr₃Si cannot support formation of the protective alumina TGO.

Example Set III also provides binary continuously-graded bond coat compositions of aluminum with chromium (Bond Coat 15), with zirconium (Bond Coat 16), and silicon (Bond Coat 17). The Bond Coats 15–17 comprise vapor pressure differentials that differ in a factor of about 10 for a binary bond coat comprising aluminum and chromium, a binary bond coat comprising aluminum and silicon differ in a ratio of about 1000:1, and a binary bond coat comprising aluminum and zirconium comprises a differential of about six orders of magnitude for the pure elements.

An example of a formation process for a binary continuously-graded bond coat that comprises aluminum and silicon will now be discussed. The steps set forth herein are also usable with other continuously-graded bond coat compositions, as embodied by the invention, and the description is not meant to limit the invention in any way. A homogeneous aluminum-based source ingot, which includes silicon in an amount of about 10 atomic percent, is placed in a tungsten crucible. The crucible is evacuated to a pressure less than about $10^{-6}$ torr. An electron beam is then directed onto the source ingot. For aluminum-based source ingot compositions, applying the electron beam for about 5 minutes at 0.5kW produces melting with little evaporation. After the 5 minute period, the power to the pool was increased to 1, 1.5, 2 and 2.5KW, in two-minute cycles to evaporate the melt pool and form a vapor cloud. The pool is essentially fully consumed by evaporation at the end of this cycle.

Figure 7:
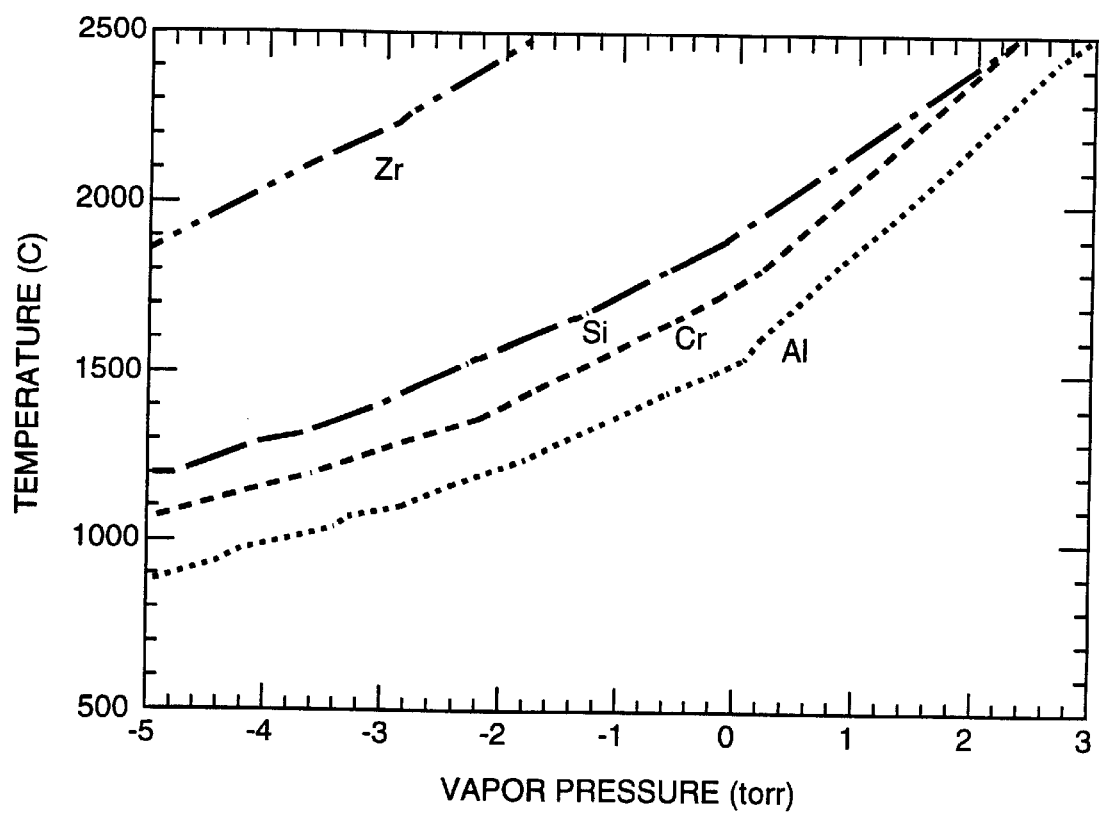
FIG. 7 is a graph of representing temperature versus vapor pressure temperature for binary source ingots, as embodied by the invention.

Evaporation begins from the melt pool at a power level of about 1 KW. The evaporant at this time is nearly all Al, since the pure-element ratios of vapor pressure are approximately 1000:1. During the two minutes at 1KW, the melt pool becomes enriched in silicon as aluminum is evaporating. As power is increased through 1.5 and 2KW to 2.5KW, silicon is then evaporated, due to the higher pool temperature and the silicon rich melt pool. FIG. 7 is a graph that illustrates vapor pressures of binary continuously-graded bond coat materials as a function of temperature. As is illustrated in the graph, the pure-element ratios of aluminum's and silicon's vapor pressures are approximately 1000:1.

Figure 8:
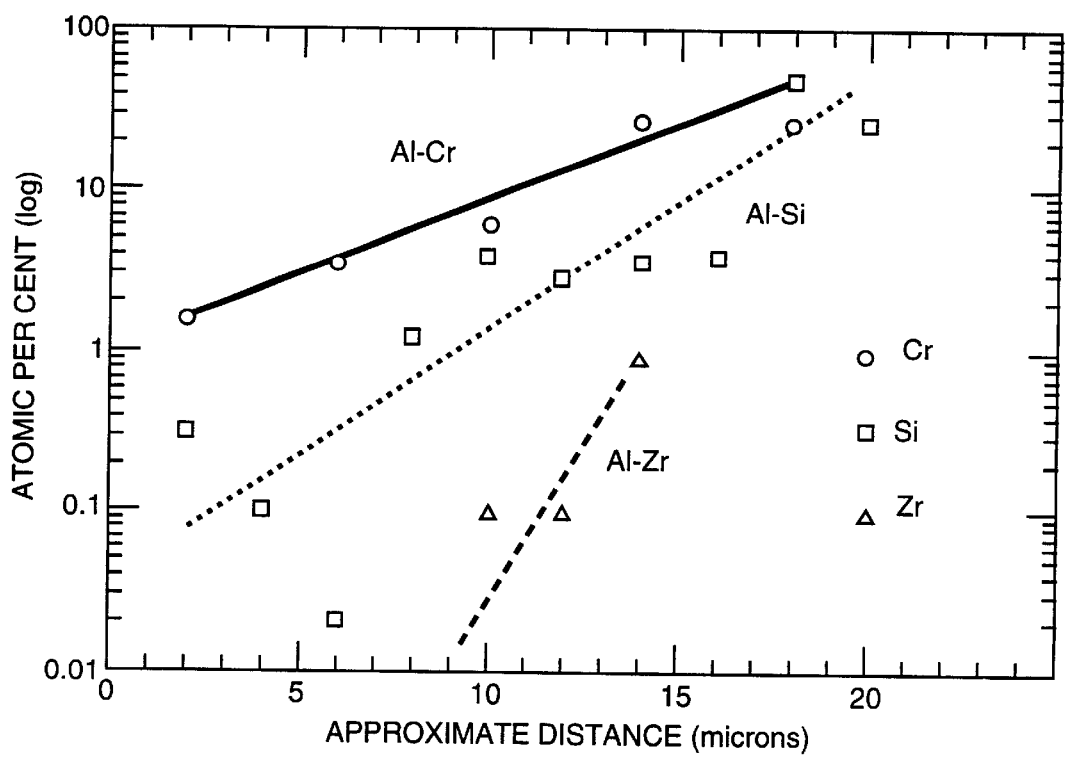
FIG. 8 is a graph representing concentration of materials in a binary continuously-graded bond coat versus distance from a substrate, as embodied by the invention.

FIG. 8 is a graph that schematically illustrates a binary continuously-graded bond coat deposit composition concentration as a function of distance from a substrate surface. Chemistries comprise Al-10a/oCr; Al-10a/oSi; and Al-0.5a/oZr, respectively. The composition concentration is measured from a substrate that is supported above a melt pool in the vapor cloud. For each binary composition, the initial deposit comprises a lower solute (active material) concentration than the concentration in the source ingot. For example, an approximately 22 micron thick Al—Cr deposit had chemistry that varied from about 1a/oCr adjacent to the substrate, to about 40a/oCr in the last material deposited. An approximately 24 micron thick Al—Si deposit varied from about 0.1a/oSi adjacent to the substrate, to about 40a/o Si. Further, an approximately 16 micron thick Al—Zr deposit varied from no zirconium adjacent to the substrate, to about 1a/oZr at the surface. Source ingots compressed about 16 gram total weight for Al—Cr, about 15 gram total weight for Al—Si, and about 15 gram total weight for Al—Zr, with pool-to-substrate distance maintained at about 15 cm.

TABLE 3

Source Ingot Composition (atomic percent)

| | Al | Cr | Si | Y | Zr |
|---|---|---|---|---|---|
| Bond Coat 9 — AlCrSi-1 | 65.5 | 21.8 | 12.7 | | |
| Bond Coat 10 — AlCrSi-1 | 53.3 | 31.7 | 15.0 | | |
| Bond Coat 11 — AlCrSi-1 | 43.1 | 40.0 | 16.9 | | |
| Bond Coat 12 20v/o — Cr₃Si(Y) | 55.0 | 29.5 | 14.1 | 1.25 | |
| Bond Coat 13 35v/o — Cr₃Si(Y) | 40.4 | 41.7 | 17.0 | 0.9 | |
| Bond Coat 14 50v/o — Cr₃Si(Y) | 28.4 | 51.6 | 19.4 | 0.6 | |
| Bond Coat 15 — AlCr-1 | 90.0 | 10.0 | | | |
| Bond Coat 16 — AlZr-1 | 99.8 | | | | 0.5 |
| Bond Coat 17 — AlSi-1 | 90.0 | | | 10.0 | |

The substrates may be heated, in which case reactions between the deposited materials for the continuously-graded bond coat and the substrate occur in situ, and thus directly produce the continuously-graded bond coat. The substrate temperature is generally maintained at a temperature below about 550° C. to avoid a liquid being deposited, that may lead to diffusional fluxes that mask the degree of gradation produced.

Turbine components provided with a TBCS that includes a continuously-graded bond coat, as embodied by the invention, provides thermal protection at the high temperatures encountered during service. Turbine components that are provided with a TBCS that includes a continuously-graded bond coat avoid mismatches due to thermal expansion amount differences. Any thermal expansion amount differences are of such magnitude that separation is minimal, and the protective nature of the TBCS is not adversely effected.

While various embodiments are described herein, it will be appreciated from the specification that various combinations of elements, variations or improvements therein may be made by those skilled in the art, and are within the scope of the invention.

We claim:

1. A method of a forming a protective coating on a substrate, the method comprising:
   (i) melting a source ingot;
   (ii) evaporating the melted source ingot to create materials to be deposited; and
   (iii) depositing said materials in a controlled manner so as to form the protective coating;
the protective coating comprising a continuously-graded bond coat, the continuously-graded bond coat comprising:
   (i) a gradient of at least one material characteristic, the gradient extending from a first value for the material characteristic at a first surface region to a second value for the material characteristic at a second surface region;
   (ii) a. at least one of: chromium (Cr), silicon (Si), hafnium (Hf), zirconium (Zr), yttrium (Y), compounds, alloys, and combinations thereof;
   b. at least one phase selected from the group consisting of α-Cr and Cr3Si; and
   c. at least one of nickel and aluminum;
wherein the first surface region comprises at least one of aluminum and nickel, and the second surface region comprises at least one of: chromium (Cr), silicon (Si), hafnium (Hf), zirconium (Zr), yttrium (Y), compounds, alloys, and combinations thereof and phases selected from α-Cr or Cr3Si.

2. A method according to claim 1, wherein the material characteristic comprises coefficients of thermal expansion.

3. A method according to claim 2, the method further comprising depositing the continuously-graded bond coat on a substrate, the first surface region comprising a region at the continuously-graded bond coat and substrate, wherein the coefficient of thermal expansion at the first surface region is greater than the coefficient of thermal expansion at the second surface region.

4. A method according to claim 1, the method further comprising applying an energy source for melting and evaporating the source ingot.

5. A method according to claim 4, wherein the step of applying the energy source comprises applying an electron beam.

6. A method according to claim 1, wherein the source ingot comprises at least one base material selected from the group consisting of:

aluminum and nickel;

and at least one active material selected from the group consisting of:

chromium (Cr), silicon (Si), hafnium (Hf), zirconium (Zr), yttrium (Y), compounds, alloys, and combinations thereof.

7. A method according to claim 6, wherein the step of evaporating comprises evaporating the highest vapor pressure material first, followed by evaporating lower vapor pressure thereafter; and the step of the depositing materials in a controlled manner to form the gradient of the at least one material characteristic comprises depositing the evaporated materials with the highest vapor pressure material first, followed by depositing lower vapor pressure materials thereafter.

8. A method according to claim 1, wherein the protective coating comprises a thermal barrier coating system, the method further comprising steps of:

depositing the continuously-graded bond coat on a substrate and forming a thermal barrier coating on the continuously-graded bond coat.

9. A method according to claim 8, the step of depositing materials in a controlled manner to form the gradient of the at least one material characteristic value further comprises:

depositing the continuously-graded bond coat on an airfoil.

10. A method according to claim 8, wherein the step of depositing materials in a controlled manner to form the gradient of the at least one material characteristic further comprises:

depositing the continuously-graded bond coat on a turbine, the turbine selected from the group consisting of:

gas turbines and jet engines.

* * * * *